US012622005B2

(12) United States Patent
Singh et al.

(10) Patent No.: US 12,622,005 B2
(45) Date of Patent: May 5, 2026

(54) INTEGRATION SCHEME FOR FABRICATING HIGH PRECISION, LOW CAPACITOR WITH UNLANDED VIA

(71) Applicant: Samsung Electronics Co., Ltd., Gyeonggi-do (KR)

(72) Inventors: Sunil Kumar Singh, Round Rock, TX (US); Sivashankar Sivasubramanian, Austin, TX (US)

(73) Assignee: Samsung Electronics Co., Ltd (KR)

( * ) Notice: Subject to any disclaimer, the term of this patent is extended or adjusted under 35 U.S.C. 154(b) by 519 days.

(21) Appl. No.: 18/103,201

(22) Filed: Jan. 30, 2023

(65) Prior Publication Data

US 2024/0186367 A1 Jun. 6, 2024

Related U.S. Application Data

(60) Provisional application No. 63/430,458, filed on Dec. 6, 2022.

(51) Int. Cl.
*H01L 21/768* (2006.01)
*H01L 23/522* (2006.01)
*H10D 1/68* (2025.01)

(52) U.S. Cl.
CPC ....... *H10D 1/692* (2025.01); *H01L 21/76814* (2013.01); *H01L 21/76834* (2013.01); *H01L 21/7687* (2013.01); *H01L 23/5223* (2013.01)

(58) Field of Classification Search
CPC ........... H01L 23/5223; H01L 23/53295; H01L 21/76807; H01L 21/76834; H01L 21/76816; H10D 1/692
See application file for complete search history.

(56) References Cited

U.S. PATENT DOCUMENTS

| | | | |
|---|---|---|---|
| 6,680,542 | B1 | 1/2004 | Gibson et al. |
| 7,732,314 | B1 | 6/2010 | Danek et al. |
| 8,431,463 | B2 | 4/2013 | Lippitt et al. |
| 9,419,243 | B2 | 8/2016 | Park et al. |
| 10,020,255 | B1 | 7/2018 | Bao et al. |
| 10,777,655 | B2 | 9/2020 | Yeoh et al. |
| 11,107,880 | B2 | 8/2021 | Xu et al. |
| 11,239,307 | B2 | 2/2022 | Zhu et al. |
| 11,348,867 | B2 | 5/2022 | Xu et al. |
| 2004/0124493 | A1 | 7/2004 | Chua |

FOREIGN PATENT DOCUMENTS

TW 200421955 10/2004

*Primary Examiner* — John A Bodnar
(74) *Attorney, Agent, or Firm* — The Farrell Law Firm, P.C.

(57) ABSTRACT

Semiconductor devices including a capacitor and methods of fabricating the semiconductor devices are disclosed. A method of fabricating a semiconductor device including a capacitor includes forming an underlayer structure including a substrate onto which metal is patterned within a first dielectric material, wherein the patterned metal forms a first metal surface of the capacitor; forming a middle layer of a second dielectric material above the underlayer structure; forming an upper layer of a third dielectric material above the middle layer; etching a supervia though the upper layer and into the middle layer, wherein the supervia hangs in the second dielectric material of the middle layer above the patterned metal forming the first metal surface of the capacitor; and performing barrier deposition and metal electroplating in the supervia, wherein the supervia forms a second metal surface of the capacitor above the first metal surface.

16 Claims, 11 Drawing Sheets

101
103   105

109
107
101

125a                    125b
109
127

113
111
109

129a      129b      129c 113      131

115

117

115

113

109

119

113

109

103

201  203  205

209  207  201

227a  227b  209  229

213
211
209

225a
225b
225
225c
213

231
213

213

219

213

211

209

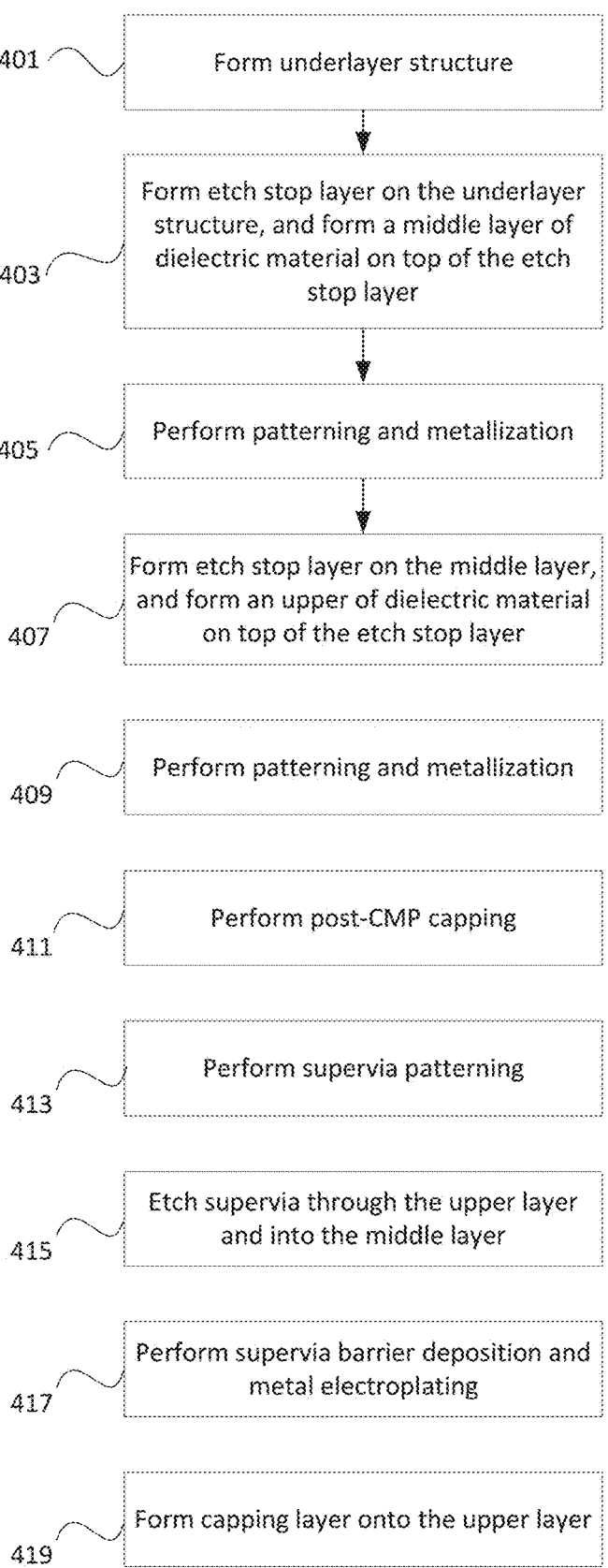

401 — Form underlayer structure

403 — Form etch stop layer on the underlayer structure, and form a middle layer of dielectric material on top of the etch stop layer 405 — Perform patterning and metallization 407 — Form etch stop layer on the middle layer, and form an upper of dielectric material on top of the etch stop layer 409 — Perform patterning and metallization 411 — Perform post-CMP capping 413 — Perform supervia patterning 415 — Etch supervia through the upper layer and into the middle layer 417 — Perform supervia barrier deposition and metal electroplating 419 — Form capping layer onto the upper layer

FIG. 4

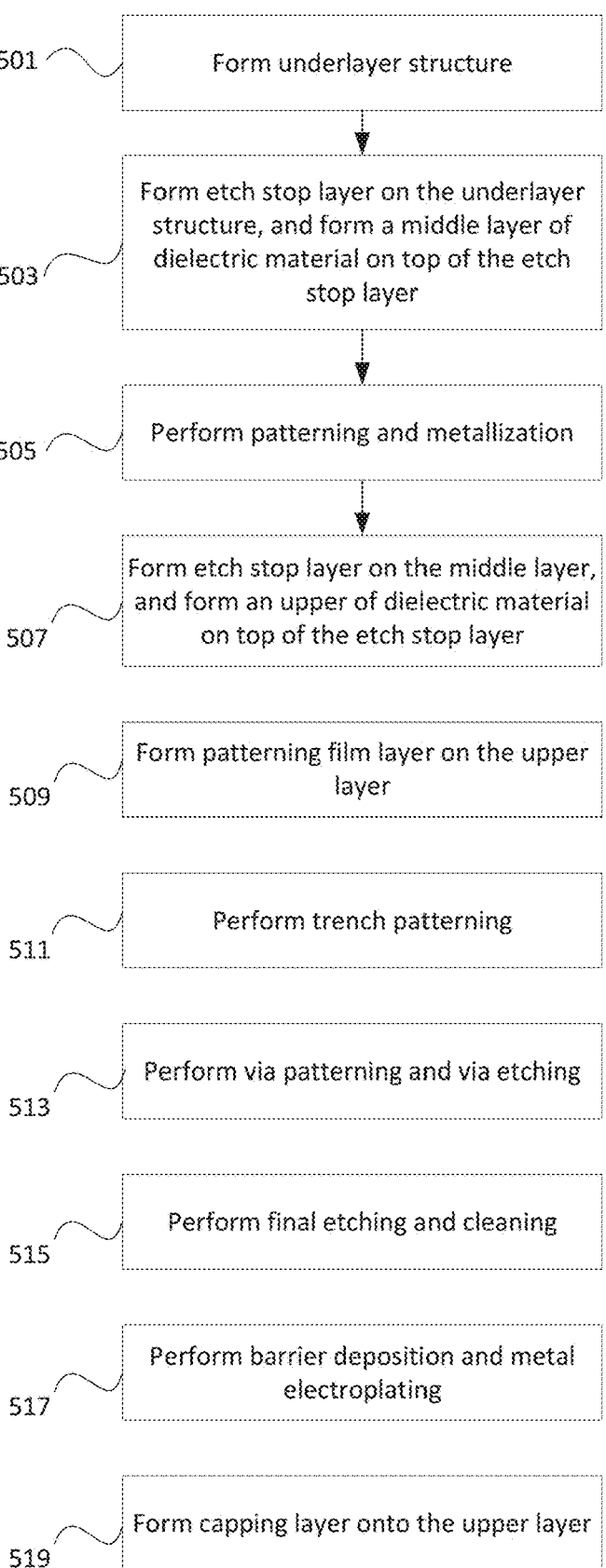

501　Form underlayer structure

503　Form etch stop layer on the underlayer structure, and form a middle layer of dielectric material on top of the etch stop layer 505　Perform patterning and metallization 507　Form etch stop layer on the middle layer, and form an upper of dielectric material on top of the etch stop layer 509　Form patterning film layer on the upper layer 511　Perform trench patterning 513　Perform via patterning and via etching 515　Perform final etching and cleaning 517　Perform barrier deposition and metal electroplating 519　Form capping layer onto the upper layer

FIG. 5

INTEGRATION SCHEME FOR FABRICATING HIGH PRECISION, LOW CAPACITOR WITH UNLANDED VIA

CROSS-REFERENCE TO RELATED APPLICATION

This application claims the priority benefit under 35 U.S.C. § 119(e) of U.S. Provisional Application No. 63/430, 458, which was filed in the U.S. Patent and Trademark Office on Dec. 6, 2022, the entire disclosure of which is incorporated herein by reference.

TECHNICAL FIELD

The disclosure generally relates to fabrication methods and resulting structures for semiconductor devices. More particularly, the subject matter disclosed herein relates to improvements to a capacitor structure for integrated circuit (IC) structure formation, and related methods to form the capacitor structure.

BACKGROUND

ICs generally become more complex and dense with each technology generation. With continued efforts toward reduction of feature size, use of multiple-patterning and other advanced lithography techniques have been on the rise.

Generally, integrated circuits (ICs) include semiconductor devices formed as a configuration of circuits on a semiconductor substrate. A complex network of signal paths are routed to connect circuit elements distributed on the substrate. Efficient routing of these signals across the device normally requires formation of multilevel or multilayered conductive networks, which can be formed using schemes, such as, e.g., single or dual damascene wiring structures.

Capacitor structures in an IC conventionally include two metal plates with an insulator between the plates. In such a configuration, the plates occupy at least a minimum surface area to achieve desired capacitances.

A conventional approach for integrating capacitors into an integrated circuit is to form transverse metal lines, or "fingers," extending outward from a larger wire interdigitating the transverse metal lines with similar metal lines of a nearby wire. However, such a configuration may impose limits on manufacturability and capacitance ranges as devices continue to decrease in size. These limits on a size of a capacitor may be problematic when a product specification requires a low capacitor, e.g., a capacitor with less than 0.5 femtofarads (fF).

Previous approaches for providing low capacitance have included increasing a space between alternating horizontal electrodes in order to reduce capacitance density or serially connecting larger capacitors together in order to reduce effective capacitance between two nodes. However, these types of approaches have produced capacitors that are still too large and/or lack the desired precision for certain applications.

SUMMARY

Accordingly, an aspect of the disclosure is to provide a small, low metal-oxide-metal (MOM) capacitor, e.g., below 0.5 fF, with high precision and effective mismatch.

Another aspect of the disclosure is to provide a customized design for an MOM capacitor.

Another aspect of the disclosure is to provide an MOM capacitor utilizing a supervia structure for improved process control.

Another aspect of the disclosure is to provide an MOM capacitor utilizing an unlanded via structure for simplified masking.

In accordance with an aspect of the disclosure, a method is provided for fabricating a semiconductor device including a capacitor. The method includes forming an underlayer structure including a substrate onto which metal is patterned within a first dielectric material, wherein the patterned metal forms a first metal surface of the capacitor; forming a middle layer of a second dielectric material above the underlayer structure; forming an upper layer of a third dielectric material above the middle layer; etching a supervia though the upper layer and into the middle layer, wherein the supervia hangs in the second dielectric material of the middle layer above the patterned metal forming the first metal surface of the capacitor; and performing barrier deposition and metal electroplating in the supervia, wherein the supervia forms a second metal surface of the capacitor above the first metal surface.

In accordance with another aspect of the disclosure, a method is provided for fabricating a semiconductor device including a capacitor. The method includes forming an underlayer structure including a substrate onto which metal is patterned within a first dielectric material, wherein the patterned metal forms a first metal surface of the capacitor; forming a middle layer of a second dielectric material above the underlayer structure; forming an upper layer of a third dielectric material above the middle layer; forming an unlanded via through the upper layer and into the middle layer, wherein the unlanded via hangs in the second dielectric material of the middle layer above the patterned metal forming the first metal surface of the capacitor; and performing barrier deposition and metal electroplating on the upper layer, wherein the unlanded via forms a second metal surface of the capacitor above the first metal surface.

In accordance with another aspect of the disclosure, a semiconductor device including a capacitor is provided. The semiconductor device includes an underlayer structure including a substrate onto which metal is patterned within a first dielectric material, wherein the patterned metal forms a first metal surface of the capacitor; a middle layer including a second dielectric material above the underlayer structure; an upper layer including a third dielectric material above the middle layer; and an unlanded via, formed though the upper layer and into the middle layer. The unlanded via hangs in the second dielectric material of the middle layer above the patterned metal forming the first metal surface of the capacitor. The unlanded via is filled with the metal and forms a second metal surface of the capacitor above the first metal surface.

BRIEF DESCRIPTION OF THE DRAWING

The above and other aspects, features, and advantages of the disclosure will be more apparent from the following detailed description taken in conjunction with the accompanying drawings, in which:

FIG. 4 is flowchart illustrating a method forming a semiconductor structure including a capacitor, according to an embodiment; and FIG. 5 is flowchart illustrating a method forming a semiconductor structure including a capacitor, according to an embodiment.

DETAILED DESCRIPTION

Figure 1A:
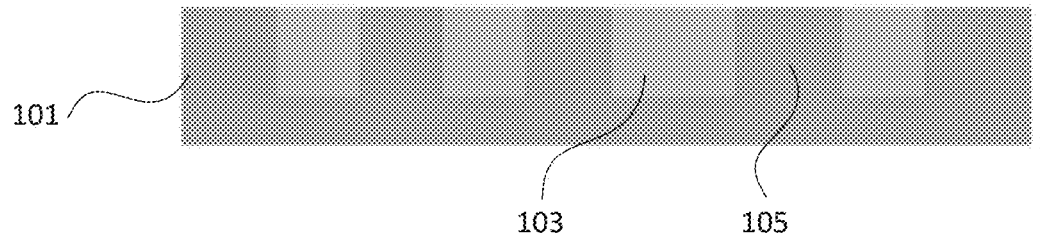
FIGS. 1A to 1J illustrate a process of forming a semiconductor structure including a capacitor, according to an embodiment.

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail to not obscure the subject matter disclosed herein.

Reference throughout this specification to "one embodiment" or "an embodiment" means that a particular feature, structure, or characteristic described in connection with the embodiment may be included in at least one embodiment disclosed herein. Thus, the appearances of the phrases "in one embodiment" or "in an embodiment" or "according to one embodiment" (or other phrases having similar import) in various places throughout this specification may not necessarily all be referring to the same embodiment. Further, the particular features, structures or characteristics may be combined in any suitable manner in one or more embodiments. In this regard, as used herein, the word "exemplary" means "serving as an example, instance, or illustration." Any embodiment described herein as "exemplary" is not to be construed as necessarily preferred or advantageous over other embodiments.

Additionally, the particular features, structures, or characteristics may be combined in any suitable manner in one or more embodiments. Also, depending on the context of discussion herein, a singular term may include the corresponding plural forms and a plural term may include the corresponding singular form. Similarly, a hyphenated term (e.g., "two-dimensional," "pre-determined," "pixel-specific," " etc.) may be occasionally interchangeably used with a corresponding non-hyphenated version (e.g., "two dimensional," "predetermined," "pixel specific," etc.), and a capitalized entry (e.g., "Counter Clock," "Row Select," "PIX-OUT," etc.) may be interchangeably used with a corresponding non-capitalized version (e.g., "counter clock," "row select," "pixout," etc.). Such occasional interchangeable uses shall not be considered inconsistent with each other.

Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. The dimensions of some of the elements may be exaggerated relative to other elements for clarity. For example, the dimensions of layers and regions may be exaggerated for clarity of illustration.

Further, if considered appropriate, reference numerals may be repeated among the figures to indicate corresponding and/or analogous elements.

The terminology used herein is for the purpose of describing some example embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being on, "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

The terms "first," "second," etc., as used herein, are used as labels for nouns that they precede, and do not imply any type of ordering (e.g., spatial, temporal, logical, etc.) unless explicitly defined as such.

The same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement some of the example embodiments disclosed herein.

Unless otherwise defined, all terms (including technical and scientific terms) used herein have the same meaning as commonly understood by one of ordinary skill in the art to which this subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "module" refers to any combination of software, firmware and/or hardware configured to provide the functionality described herein in connection with a module. For example, software may be embodied as a software package, code and/or instruction set or instructions, and the term "hardware," as used in any implementation described herein, may include, for example, singly or in any combination, an assembly, hardwired circuitry, programmable circuitry, state machine circuitry, and/or firmware that stores instructions executed by programmable circuitry. The modules may, collectively or individually, be embodied as circuitry that forms part of a larger system, e.g., but not limited to, an IC, system on-a-chip (SoC), an assembly, etc.

Hereinafter, two different processes are provided for forming a semiconductor structure including a capacitor. As described above, a capacitor in an IC generally includes two metal surfaces with an insulator between the surfaces.

In the first process, a supervia is utilized for the formation of one of the metal surfaces, and in the second process, an unlanded via is utilized for the formation of one of the metal surfaces. While the use of a supervia in the first process may afford greater process control in the capacitor formation, the formation of the supervia may require an additional via mask and process. Although not providing the same process control as the first process, the unlanded via in the second process does not require an additional mask, only mask designing at a previous metal layer. As such, there may be a tradeoff between the process control of the first process and the simplicity of the second process.

FIGS. 1A to 1J illustrate a process of forming a semiconductor structure including a capacitor, according to an embodiment. For convenience of description, the process illustrated in FIGS. 1A to 1J may be referred to as the "first process".

Referring to FIG. 1A, an underlayer structure 101 is formed. The underlayer structure 101 includes a substrate, onto which patterned metal 103 is lithographically formed within a dielectric material 105, e.g., using a damascene process. The patterned metal 103 forms a first metal surface of the capacitor. The patterned metal 103 may include copper (Cu), aluminum (Al), ruthenium (Ru), cobalt (Co), rhodium (Rh), nickel (Ni), molybdenum (Mo), tungsten (W), a combination thereof, etc.

As the capacitance of an MOM capacitor may be proportional to the dielectric constant (x) of the dielectric material 105, the dielectric material 105 may be configured to provide a desirable capacitance density of the capacitor. The dielectric material 105 may include a material having a dielectric constant (k value) less than 3.9, e.g., an ultra-low-k (ULK) dielectric, a low-k (LK) dielectric, an extreme low-k (ELK) dielectric, etc.

Figure 1B:
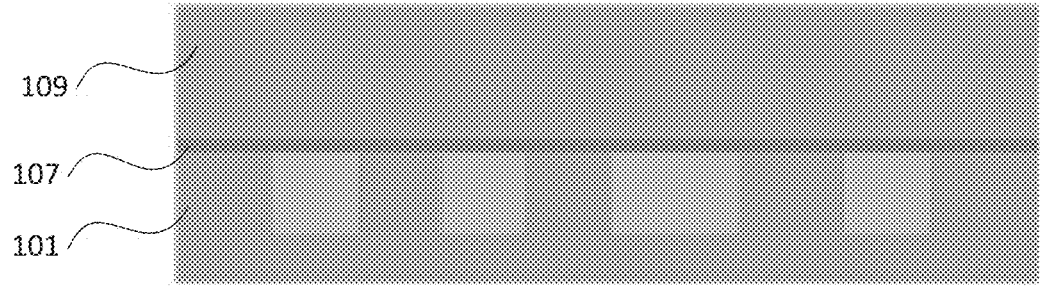

Referring to FIG. 1B, an etch stop layer 107 is deposited on the underlayer structure 101, and a middle layer 109 of dielectric material is deposited on top of the etch stop layer 107. The dielectric material of the middle layer 109 may be the same as the dielectric material 105 or may be a different dielectric material than the dielectric material 105.

Figure 1C:
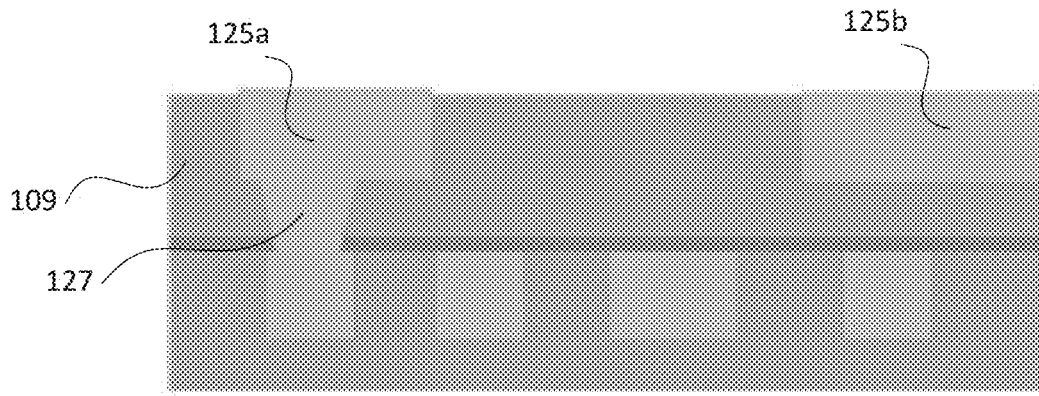

Referring to FIG. 1C, patterning and metallization is performed on the middle layer 109, forming a via 127 and metal conductors 125a and 125b. For example, a dual damascene structure formation (trench and via) may performed.

Figure 1D:
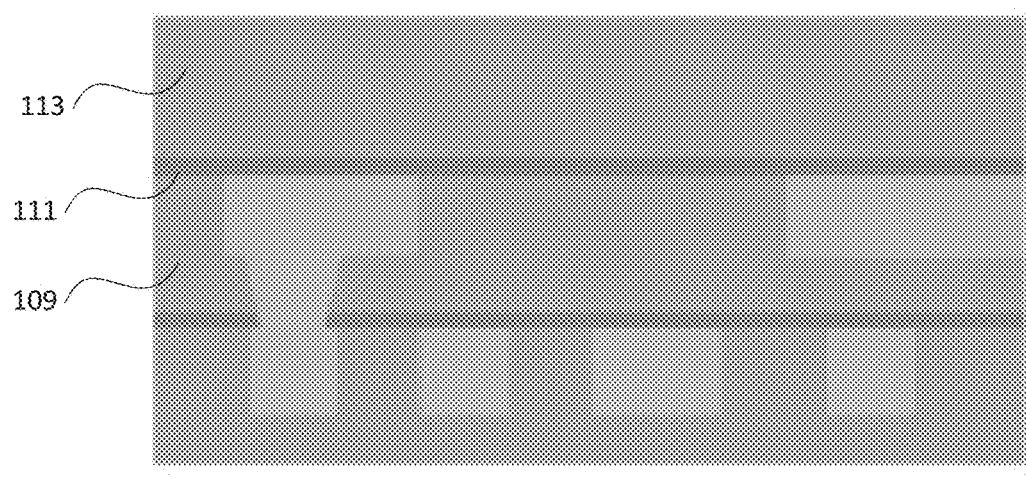

Referring to FIG. 1D, an etch stop layer 111 is deposited on the middle layer 109, and an upper layer 113 of dielectric material is deposited on top of the etch stop layer 111. The dielectric material of the upper layer 113 may be the same as the dielectric material 105 and/or the middle layer 109, or may be a different dielectric material.

Figure 1E:
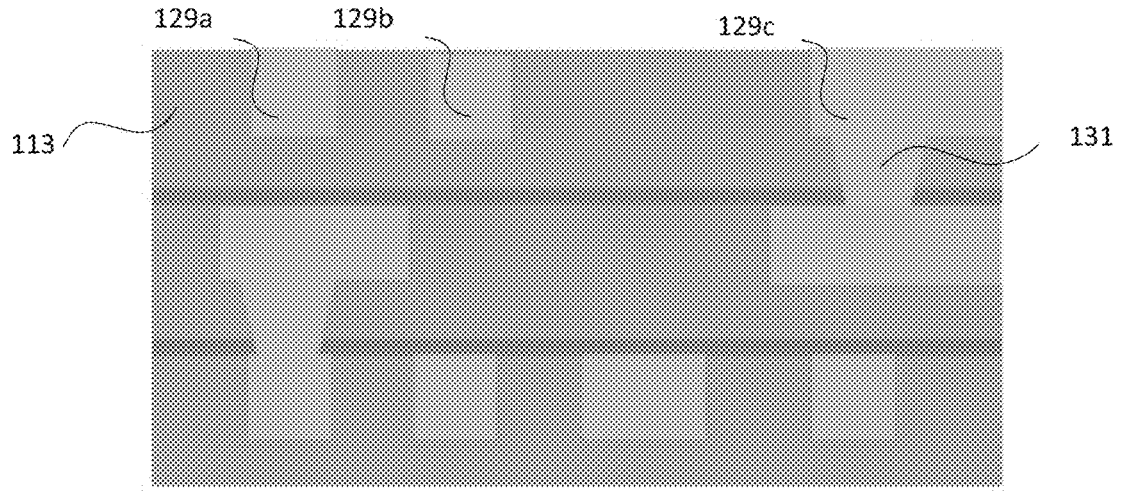

Referring to FIG. 1E, patterning and metallization is performed on the upper layer 113, forming a via 131 and metal conductors 129a, 129b, and 129c. For example, a dual damascene structure formation (trench and via) may performed.

Figure 1F:
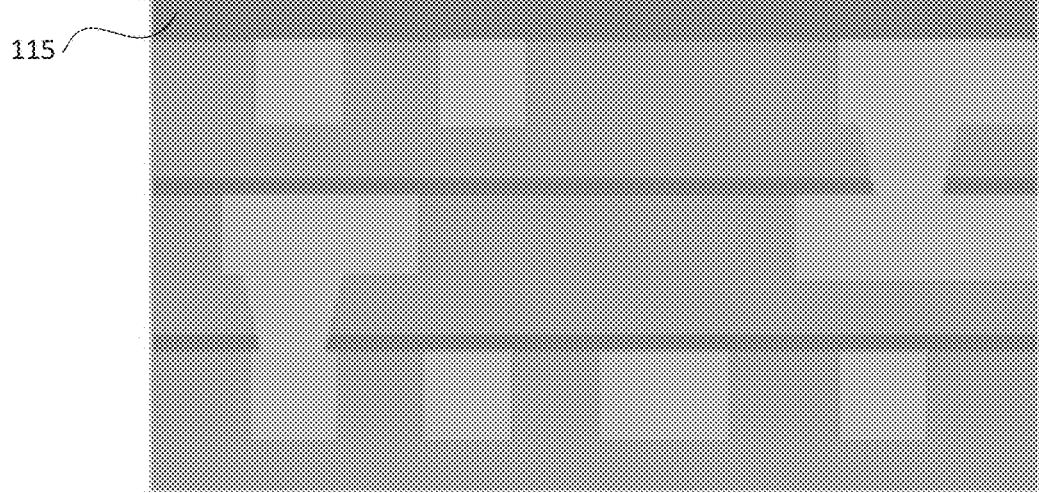

Referring to FIG. 1F, after chemical mechanical polishing (CMP) is performed, a capping 115 is formed. For example, the post-CMP capping may include silicon carbon nitride (SiCN), nitrogen-doped silicon carbide (NDC), etc.

Figures 1G, 1H:

Referring to FIG. 1G, supervia patterning 117 (e.g., lithography) is performed on the post-CMP cap 115.

Referring to FIG. 1H, a supervia 119 is etched through the upper layer 113 and into the middle layer 109.

In accordance with FIGS. 1G and 1H, the process generally includes providing a new mask patterning step to remove selected portions of the post-CMP cap 115, such that high aspect ratio etching may be performed to form the supervia through the middle and upper layers 109 and 113 of dielectric material. Additionally, the selected portions of the post-CMP cap 115 that are removed can provide improved visibility to alignment markers for improved overlay tolerances.

Commonly, a via is to land on metal, e.g., the patterned metal 103. However, in accordance with an embodiment of the disclosure, as illustrated in FIG. 1H, the supervia 119 hangs in the dielectric of the middle layer 109.

More specifically, etching is performed through the upper layer 113 until the etch stop layer 111. The etch stop layer 111 is then removed, and further etching is performed into the middle layer 109. For example, the middle layer 109 of dielectric material may be etched using F-based chemistry (e.g., octafluorocyclobutane (C4F8), trifluoromethyl radical (CF3), difluoromethane (CH2F2), etc.) leaving 10-50 nm of material.

Figure 1I:
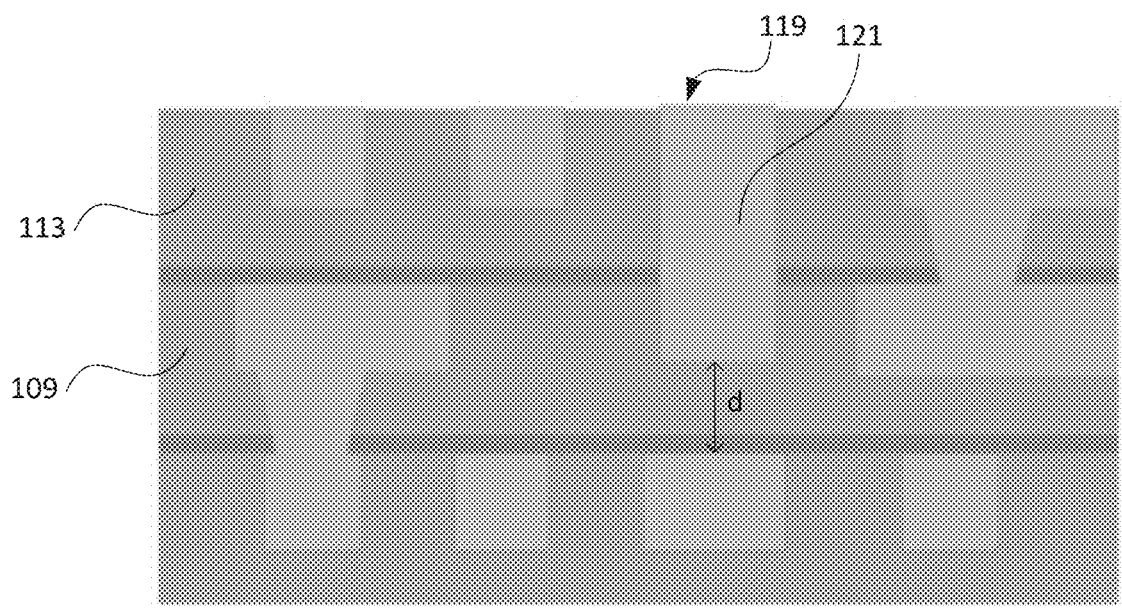

Referring to FIG. 1I, supervia barrier deposition and metal electroplating, e.g., Cu plating, are performed. More specifically, a conductive metal 121 fills the supervia 119, forming a second metal surface of the capacitor opposite the patterned metal 103. As shown in FIGS. 1H and 1I, a distance (d) between the second metal surface of the supervia 119 and the first metal surface of the patterned metal 103 is determined by the depth of etch for the supervia 119 into the middle layer 109. As described above with reference to FIG. 1H, the distance (d) may be, e.g., 10-50 nm, determined by the amount of dielectric material remaining in the middle layer 109 after etching.

Figure 1J:
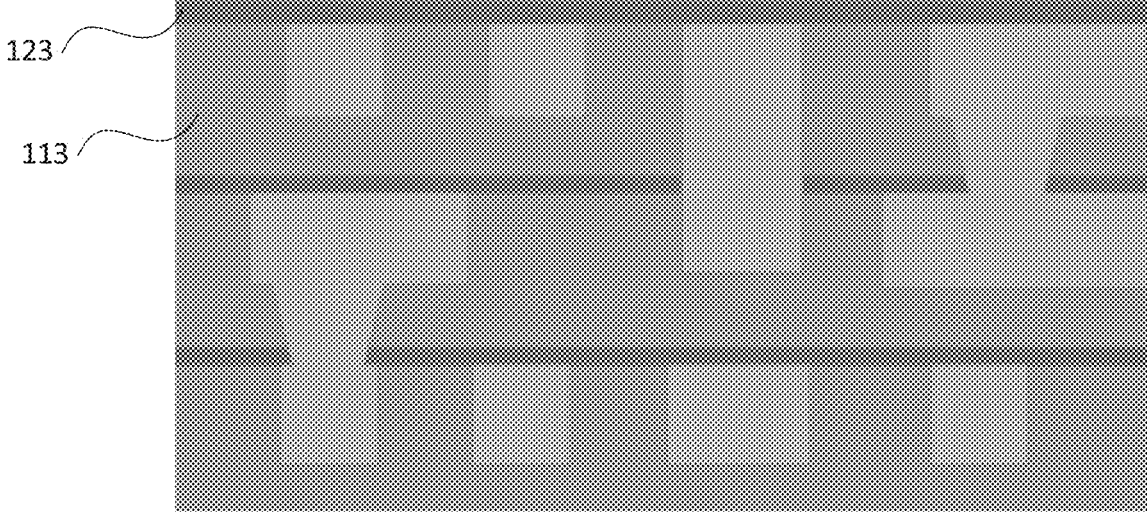

Referring to FIG. 1J, a capping layer 123 (e.g., a post-CMP cap) is deposited onto the upper layer 113. For example, the capping layer 123 may include SiCN, NDC, etc.

FIGS. 2A to 2J illustrate a process of forming a semiconductor structure including a capacitor, according to an embodiment. For convenience of description, the process illustrated in FIGS. 2A to 2J may be referred to as the "second process".

As described above, although not providing the same process control as the first process, which utilizes a supervia, the second process illustrated in FIGS. 2A to 2J, which utilizes an unlanded via instead of a supervia, does not require an additional mask, only mask designing at a previous metal layer.

Figure 2A:
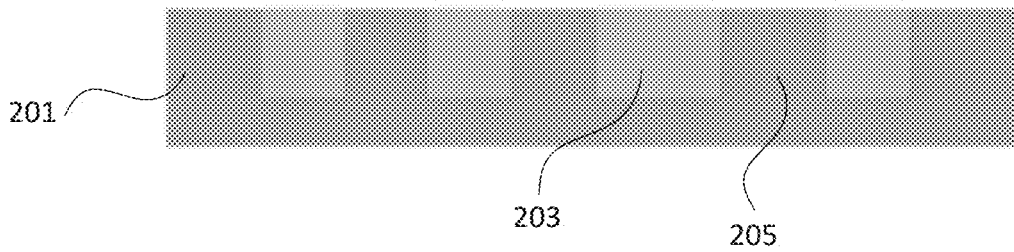
FIGS. 2A to 2J illustrate a process of forming a semiconductor structure including a capacitor, according to an embodiment.

Referring to FIG. 2A, an underlayer structure 201 is formed. The underlayer structure 201 includes a substrate, onto which patterned metal 203 is lithographically formed within a dielectric material 205, e.g., using a damascene process. The patterned metal 203 forms a first metal surface of the capacitor. The patterned metal 203 may include Cu, Al, Ru, Co, Rh, Ni, Mo, W, a combination thereof, etc.

As described above, the dielectric material 205 may be configured to provide a desirable capacitance density of the capacitor. For example, the dielectric material 205 may include ULK, ELK, LK, etc., having a dielectric constant (k value) less than 3.9.

Figure 2B:
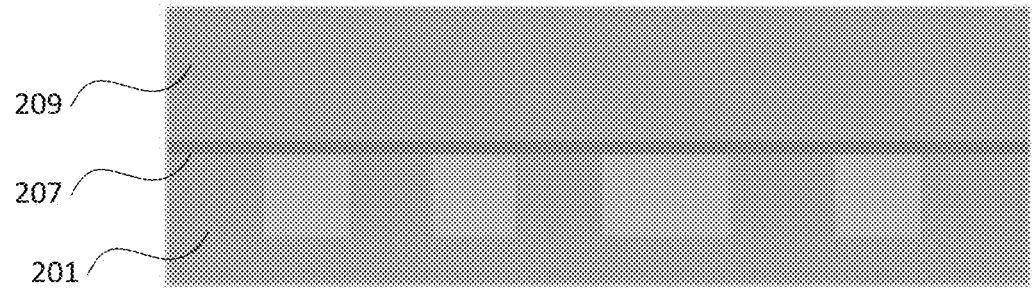

Referring to FIG. 2B, an etch stop layer 207 is deposited on the underlayer structure 201, and a middle layer 209 of dielectric material is deposited on top of the etch stop layer 207. The dielectric material of the middle layer 209 may be the same as the dielectric material 205 or may be a different dielectric material than the dielectric material 205.

Figure 2C:
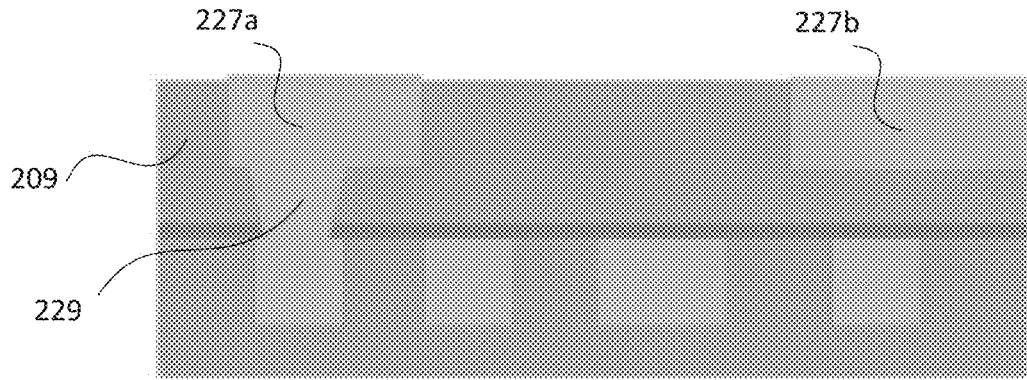

Referring to FIG. 2C, patterning and metallization is performed on the middle layer 209, forming a via 229 and metal conductors 227a and 227b. For example, a dual damascene structure formation (trench and via) may performed.

Figure 2D:
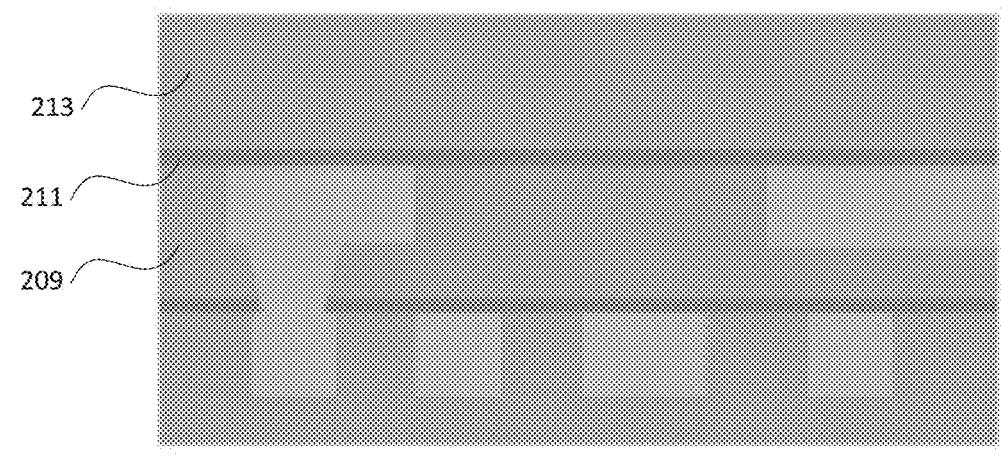

Referring to FIG. 2D, an etch stop layer 211 is deposited on the middle layer 209, and an upper layer 213 of dielectric material is deposited on top of the etch stop layer 211. The dielectric material of the upper layer 213 may be the same as the dielectric material 205 and/or the middle layer 209, or may be a different dielectric material.

Figure 2E:
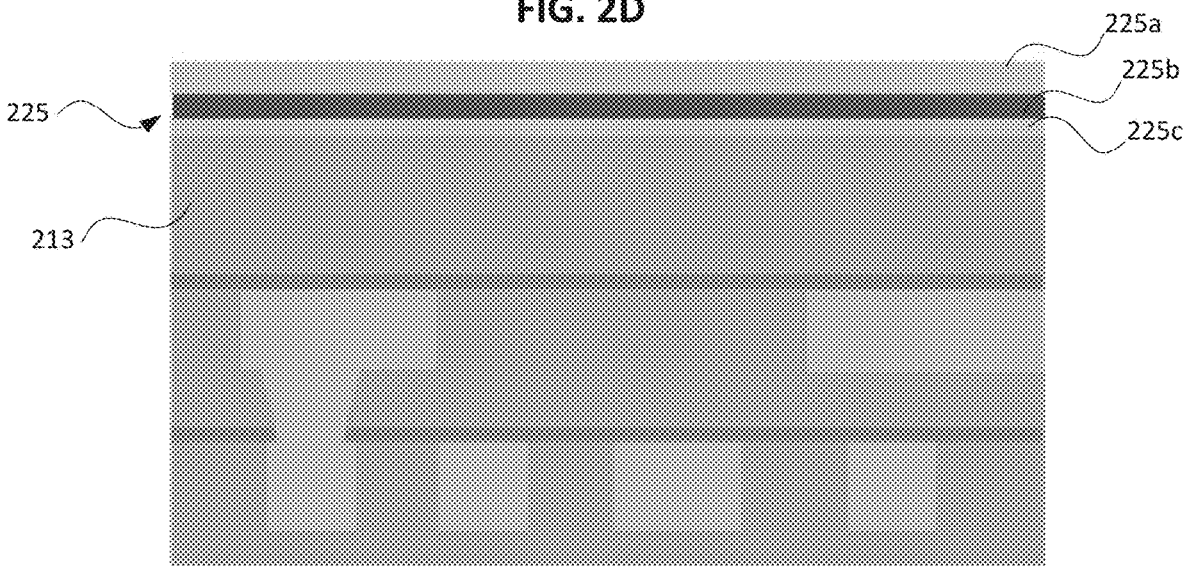

Referring to FIG. 2E, patterning film layer 225 is deposited on top of the upper layer 213. For example, the patterning film layer 225 includes a dielectric hard mask layer 225a, a metal hard mask (MHM) layer 225b, and another dielectric hard mask layer 225c.

Figure 2F:
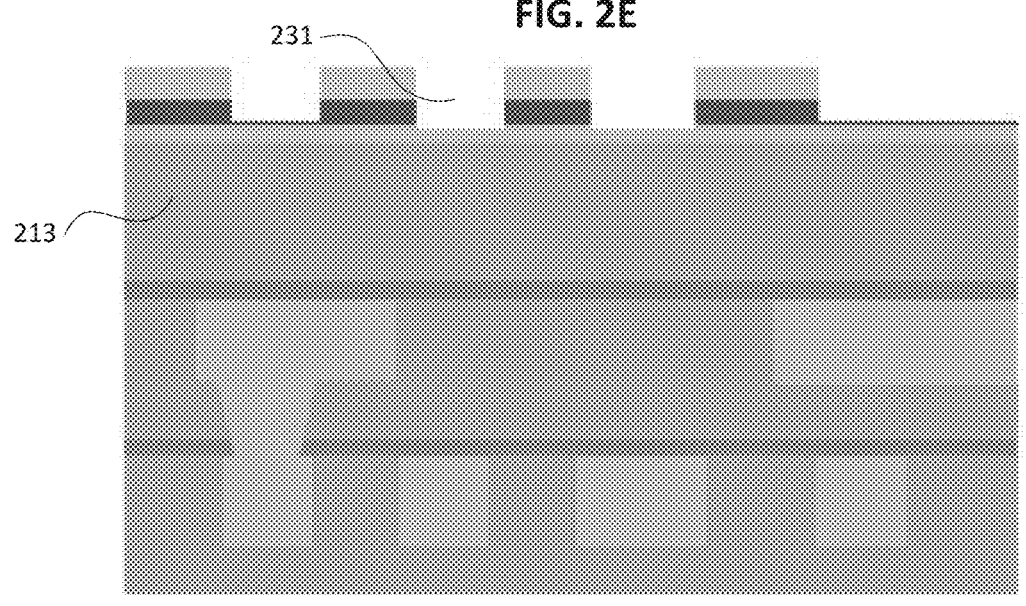

Referring to FIG. 2F, trench patterning (e.g., trench lithography/etch/clean) is performed. That is, some of the dielectric hard mask layer 225a, the MHM layer 225b, and the dielectric hard mask layer 225c are removed (opened), e.g., see area 231.

Figure 2G:
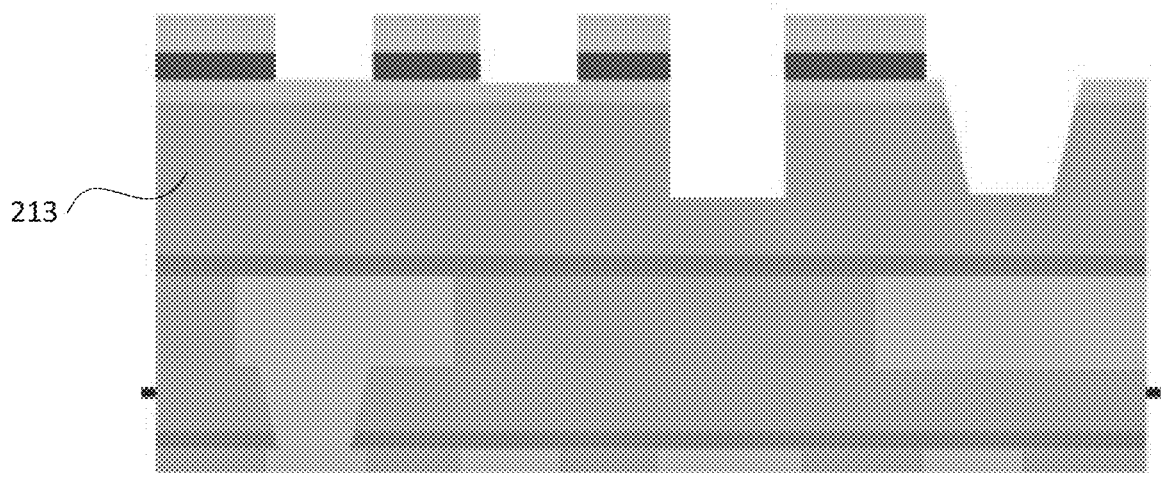

Referring to FIG. 2G, via patterning and via etching are performed on the opened areas of the upper layer 213. For example, F-based chemistry (C4F8, CF3, CH2F2, etc.) can etch this material.

Figure 2H:
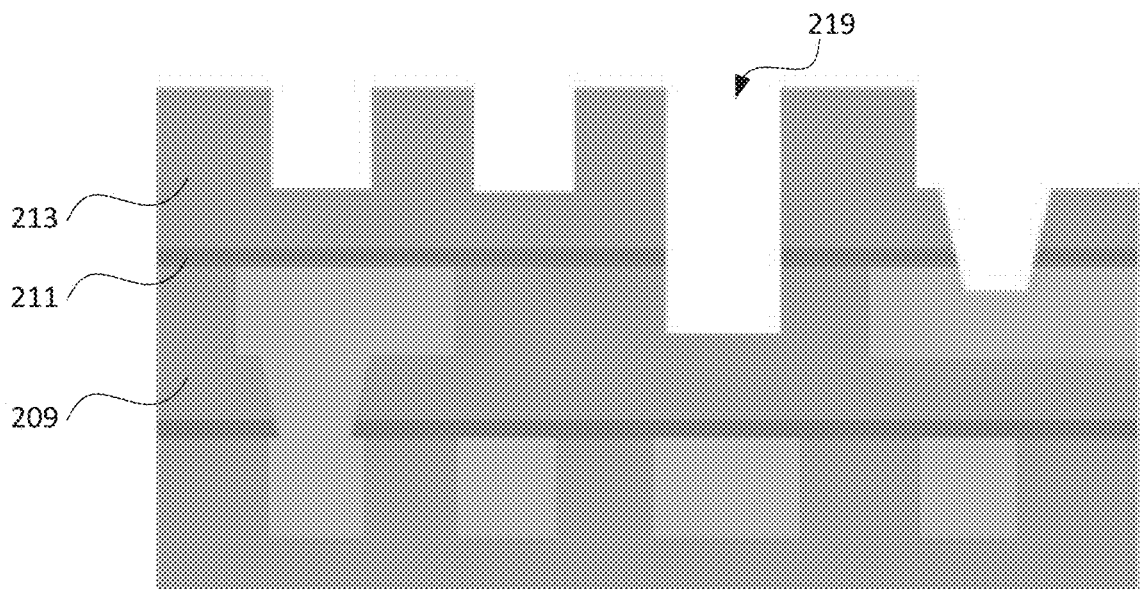

Referring to FIG. 2H, final etching and cleaning are performed. That is, final etching is performed to set the vias to a desired depth and then the surfaces are cleaned in preparation for barrier deposition and metal electroplating.

More specifically, an unlanded via 219 is etched through the upper layer 213 and into the middle layer 209. Commonly, a via is to land on metal, e.g., the patterned metal 103. However, in accordance with an embodiment of the disclosure, the unlanded via 219 hangs in the dielectric of the middle layer 209.

More specifically, etching is performed through the upper layer 213 until the etch stop layer 211. The etch stop layer 211 is then removed, and further etching is performed into the middle layer 209. For example, the middle layer 209 of dielectric material may be etched using F-based chemistry (e.g., C4F8, CF3, CH2F2, etc.) leaving 10-50 nm of material.

Figure 2I:
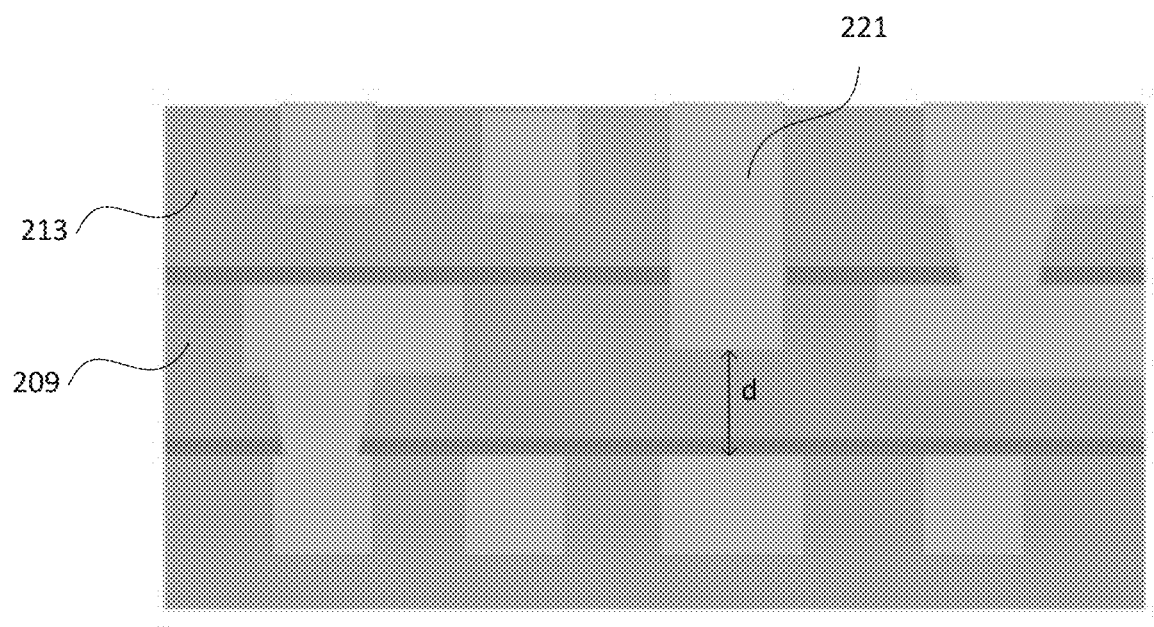

Referring to FIG. 2I, barrier deposition and metal electroplating, e.g., Cu plating, are performed. More specifically, a conductive metal 221 fills the unlanded via 219, forming a second metal surface of the capacitor opposite the patterned metal 203. As shown in FIGS. 2H and 2I, a distance (d) between the second metal surface of the unlanded via 219 and the first metal surface of the patterned metal 203 is determined by the depth of etch for the unlanded via 219 into the middle layer 209. As described above with reference to FIG. 2H, the distance (d) may be, e.g., 10-50 nm, determined by the amount of dielectric material remaining in the middle layer 209 after etching.

Figure 2J:
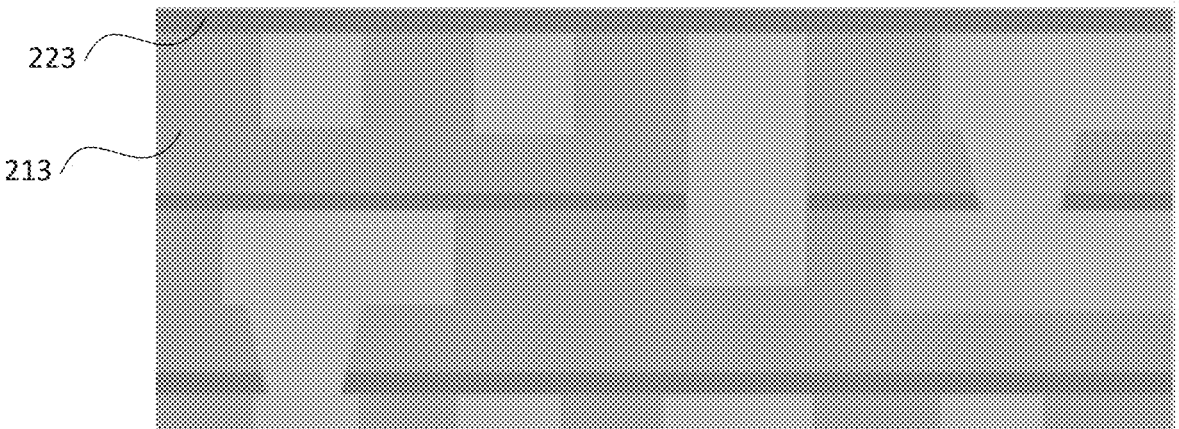

Referring to FIG. 2J, a capping layer 223 (e.g., a post-CMP cap) is deposited onto the upper layer 213.

Figure 3:
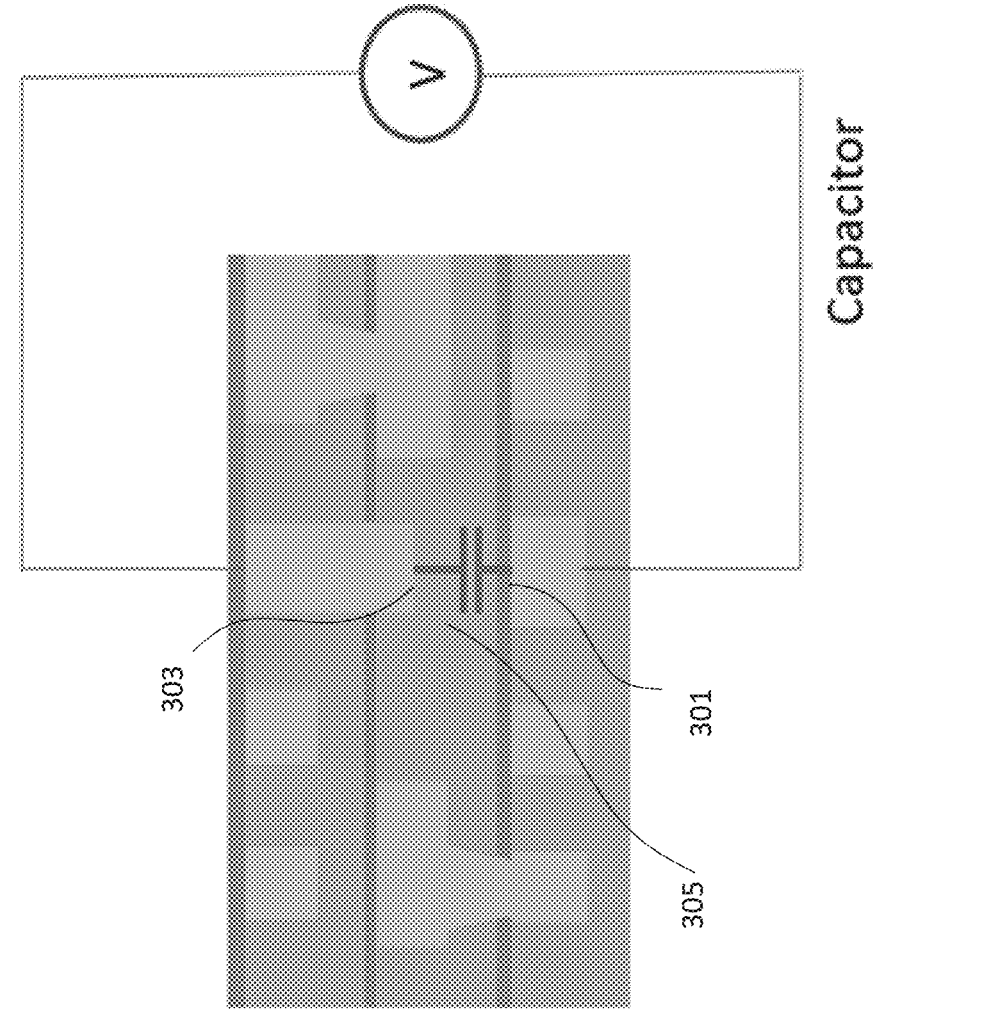
FIG. 3 illustrates a capacitor, according to an embodiment.

FIG. 3 illustrates a capacitor, according to an embodiment.

Referring to FIG. 3, the capacitor includes a first metal plate 301 and a second metal plate 303 with an insulator 305 (i.e., dielectric material) therebetween. The capacitor illustrated in FIG. 3 may formed using the first process illustrated in FIGS. 1A to 2J or the second process illustrated in FIGS. 2A to 2J.

As described above, minimal process steps are required to make the capacitor device. Thus, the embodiments of the disclosure provide an MOM capacitor with improved process control, low capacitance, and a requirement of minimal area to achieve the low capacitance.

FIG. 4 is flowchart illustrating a method forming a semiconductor structure including a capacitor, according to an embodiment. Specifically, the method illustrated in FIG. 4 corresponds to the first process illustrated in FIGS. 1A to 1J.

Referring to FIG. 4, in step 401, an underlayer structure is formed. For example, as illustrated in FIG. 1A, the underlayer structure includes a substrate, onto which patterned metal is lithographically formed within a dielectric material. The patterned metal forms a first metal surface of the capacitor.

In step 403, an etch stop layer is deposited on the underlayer structure, and a middle layer of dielectric material is deposited on top of the etch stop layer, e.g., as illustrated in FIG. 1B.

In step 405, patterning and metallization is performed on the middle layer, e.g., as illustrated in FIG. 1C.

In step 407, an etch stop layer is deposited on the middle layer, and an upper layer of dielectric material is deposited on top of the etch stop layer, e.g., as illustrated in FIG. 1D.

In step 409, patterning and metallization is performed on the upper layer, e.g., as illustrated in FIG. 1E.

In step 411, post-CMP capping 115 is performed, e.g., as illustrated in FIG. 1F.

In step 413, supervia patterning is performed on the post-CMP cap, e.g., as illustrated in FIG. 1G.

In step 415, a supervia is etched through the upper layer and into the middle layer, following the supervia pattern, e.g., as illustrated in FIG. 1H. In accordance with an embodiment of the disclosure, the supervia hangs in the dielectric of the middle layer.

In step 417, supervia barrier deposition and metal electroplating are performed, e.g., as illustrated in FIG. 1I. More specifically, a conductive metal fills the supervia, forming a second metal surface of the capacitor opposite the patterned metal formed in step 401.

In step 419, a capping layer is deposited onto the upper layer, e.g., as illustrated in FIG. 1J.

FIG. 5 is flowchart illustrating a method forming a semiconductor structure including a capacitor, according to an embodiment. Specifically, the method illustrated in FIG. 5 corresponds to the second process illustrated in FIGS. 2A to 2J.

Referring to FIG. 5, in step 501, an underlayer structure is formed. For example, as illustrated in FIG. 2A, the underlayer structure includes a substrate, onto which patterned metal is lithographically formed within a dielectric material. The patterned metal forms a first metal surface of the capacitor.

In step 503, an etch stop layer is deposited on the underlayer structure, and a middle layer of dielectric material is deposited on top of the etch stop layer, e.g., as illustrated in FIG. 2B.

In step 505, patterning and metallization is performed on the middle layer, e.g., as illustrated in FIG. 2C.

In step 507, an etch stop layer is deposited on the middle layer, and an upper layer of dielectric material is deposited on top of the etch stop layer, e.g., as illustrated in FIG. 2D.

In step 509, a patterning film layer is formed on the upper layer, e.g., as illustrated in FIG. 2E.

In step 511, trench patterning is performed to open areas of the patterning film layer, e.g., as illustrated in FIG. 2F.

In step 513, via patterning and via etching are performed on the opened areas, e.g., as illustrated in FIG. 2G.

In step 515, final etching and cleaning are performed, such that an unlanded via 219 is etched through the upper layer and into the middle layer, e.g., as illustrated in FIG. 2H. In accordance with an embodiment of the disclosure, the unlanded via hangs in the dielectric of the middle layer.

In step 517, barrier deposition and metal electroplating are performed, e.g., as illustrated in FIG. 2I. As described above, a conductive metal fills the unlanded via, forming a second metal surface of the capacitor opposite the patterned metal formed in step 501.

In step 519, a capping layer (e.g., a post-CMP cap) is deposited onto the upper layer, e.g., as illustrated in FIG. 2J.

Embodiments of the subject matter and the operations described in this specification may be implemented in digital electronic circuitry, or in computer software, firmware, or hardware, including the structures disclosed in this specification and their structural equivalents, or in combinations of one or more of them. Embodiments of the subject matter described in this specification may be implemented as one or more computer programs, i.e., one or more modules of computer-program instructions, encoded on computer-storage medium for execution by, or to control the operation of data-processing apparatus. Alternatively or additionally, the program instructions can be encoded on an artificially-generated propagated signal, e.g., a machine-generated electrical, optical, or electromagnetic signal, which is generated to encode information for transmission to suitable receiver apparatus for execution by a data processing apparatus. A computer-storage medium can be, or be included in, a computer-readable storage device, a computer-readable storage substrate, a random or serial-access memory array or device, or a combination thereof. Moreover, while a computer-storage medium is not a propagated signal, a computer-storage medium may be a source or destination of computer-program instructions encoded in an artificially-generated propagated signal. The computer-storage medium can also be, or be included in, one or more separate physical components or media (e.g., multiple CDs, disks, or other storage devices). Additionally, the operations described in this specification may be implemented as operations performed by a data-processing apparatus on data stored on one or more computer-readable storage devices or received from other sources.

While this specification may contain many specific implementation details, the implementation details should not be construed as limitations on the scope of any claimed subject matter, but rather be construed as descriptions of features specific to particular embodiments. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described herein. Other embodiments are within the scope of the following claims. In some cases, the actions set forth in the claims may be performed in a different order and still achieve desirable results. Additionally, the processes depicted in the accompanying figures do not necessarily require the particular order shown, or sequential order, to achieve desirable results. In certain implementations, multitasking and parallel processing may be advantageous.

While the present disclosure has been shown and described with reference to certain embodiments thereof, it will be understood by those skilled in the art that various changes in form and details may be made therein without departing from the spirit and scope of the disclosure as defined by the appended claims and their equivalents.

What is claimed is:

1. A method of fabricating a semiconductor device including a capacitor, the method comprising:

forming an underlayer structure including a substrate onto which patterned metal is formed within a first dielectric material of the substrate, wherein the patterned metal forms a first metal surface of the capacitor;

forming a middle layer of a second dielectric material above the underlayer structure;

forming an upper layer of a third dielectric material above the middle layer;

etching a supervia through the upper layer and into the middle layer, wherein the supervia is disposed in the second dielectric material of the middle layer above the patterned metal forming the first metal surface of the capacitor; and performing barrier deposition and metal electroplating in the supervia, wherein a metal on the supervia forms a second metal surface of the capacitor above the first metal surface.

2. The method of claim 1, further comprising performing patterning and metallization on at least one of the middle layer or the upper layer.

3. The method of claim 1, further comprising forming an etch stop layer on top of at least one of the underlayer structure or the middle layer.

4. The method of claim 1, further comprising performing post-chemical mechanical polishing (CMP) capping on the upper layer before etching the supervia.

5. The method of claim 4, further comprising performing supervia patterning on the post-CMP cap, wherein the supervia is etched according to the supervia patterning.

6. The method of claim 1, further comprising forming a capping layer onto the upper layer after performing barrier deposition and metal electroplating in the supervia.

7. The method of claim 1, wherein the first dielectric material, the second dielectric material, and the third dielectric material include a same dielectric material.

8. A method of fabricating a semiconductor device including a capacitor, the method comprising:

forming an underlayer structure including a substrate onto which patterned metal is formed within a first dielectric material of the substrate, wherein the patterned metal forms a first metal surface of the capacitor;

forming a middle layer of a second dielectric material above the underlayer structure;

forming an upper layer of a third dielectric material above the middle layer;

forming an unlanded via through the upper layer and into the middle layer, wherein the unlanded via is disposed in the second dielectric material of the middle layer above the patterned metal forming the first metal surface of the capacitor; and performing barrier deposition and metal electroplating on the upper layer, wherein a metal on the unlanded via forms a second metal surface of the capacitor above the first metal surface.

9. The method of claim 8, further comprising performing patterning and metallization on the middle layer.

10. The method of claim 8, further comprising forming an etch stop layer on top of at least one of the underlayer structure or the middle layer.

11. The method of claim 8, further comprising forming a patterning film layer on the upper layer before forming an unlanded via.

12. The method of claim 11, wherein the patterning film layer includes at least one of a first dielectric hard mask layer, a metal hard mask (MHM) layer, or a second dielectric hard mask layer.

13. The method of claim 11, further comprising creating open areas of the patterning film layer by performing trench patterning.

14. The method of claim 13, wherein forming the unlanded via comprises:

performing via patterning and via etching on the opened areas; and performing final etching and cleaning on the patterned and etched via.

15. The method of claim 8, further comprising forming a capping layer onto the upper layer after performing barrier deposition and metal electroplating on the upper layer.

16. The method of claim 8, wherein the first dielectric material, the second dielectric material, and the third dielectric material include a same dielectric material.

* * * * *